United States Patent [19]

Schnizlein

[11] Patent Number: 5,663,664
[45] Date of Patent: Sep. 2, 1997

[54] PROGRAMMABLE DRIVE STRENGTH OUTPUT BUFFER WITH SLEW RATE CONTROL

[75] Inventor: Paul G. Schnizlein, Austin, Tex.

[73] Assignee: Advanced Micro Devices, Inc., Sunnyvale, Calif.

[21] Appl. No.: 675,310

[22] Filed: Jul. 1, 1996

Related U.S. Application Data

[63] Continuation of Ser. No. 356,753, Dec. 15, 1994, abandoned.

[51] Int. Cl.⁶ .................. H03K 17/30; H03K 19/02
[52] U.S. Cl. .................. 326/83; 326/81; 326/50; 326/33; 326/27
[58] Field of Search .................. 326/81, 80, 82, 326/83, 49, 50, 26, 27, 37, 33

[56] References Cited

U.S. PATENT DOCUMENTS

| | | | |
|---|---|---|---|
| 4,825,101 | 4/1989 | Walters, Jr. ............. | 326/83 |
| 4,855,623 | 8/1989 | Flaherty ............. | 326/83 |
| 5,097,152 | 3/1992 | Kohda et al. ............. | 326/80 |
| 5,111,075 | 5/1992 | Ferry et al. ............. | 326/87 |
| 5,157,282 | 10/1992 | Ong et al. ............. | 326/27 |
| 5,194,765 | 3/1993 | Dunlop et al. ............. | 326/87 |
| 5,216,289 | 6/1993 | Hahn et al. ............. | 326/27 |
| 5,248,906 | 9/1993 | Mahmood . | |
| 5,315,174 | 5/1994 | Chang et al. ............. | 326/27 |
| 5,321,319 | 6/1994 | Mahood ............. | 307/443 |
| 5,341,040 | 8/1994 | Garverick et al. ............. | 326/27 |

FOREIGN PATENT DOCUMENTS

| | | |
|---|---|---|
| A-0 315 473 | 10/1989 | European Pat. Off. . |
| A-0 608 615 | 7/1993 | European Pat. Off. . |
| A-39 36 676 | 3/1989 | Germany . |
| 3117020 | 5/1991 | Japan . |
| WO-A-8903614 | 4/1989 | WIPO . |

*Primary Examiner*—Edward P. Westin
*Assistant Examiner*—Richard Roseen
*Attorney, Agent, or Firm*—Fulbright & Jaworski L.L.P.

[57] ABSTRACT

A programmable drive strength buffer includes a control signal used to enable/disable an output drive transistor slew rate control circuit, and a current drive strength control bits which are used to select weak, medium or strong current drive capability over an ISA bus with loads varying from 60 pF to 240 pF for a supply voltage of 5.0 or 3.3 volts.

12 Claims, 3 Drawing Sheets

5,663,664

PROGRAMMABLE DRIVE STRENGTH OUTPUT BUFFER WITH SLEW RATE CONTROL

SPECIFICATION

This application is a continuation of application Ser. No. 08/356,753, filed Dec. 15, 1994, now abandoned.

BACKGROUND OF THE INVENTION

1. Field of the Invention.

This invention relates to an output buffer wherein the drive strength of the output buffer is programmable. More particularly, this invention relates to an output buffer connected to an ISA bus, wherein the drive strength is programmable for a supply voltage range of 3.3–5.0 volts with a capacitive load range from 60 pF to 240 pF.

2. Brief Description of the Related Technology

Input/output (I/O) buffers for ISA buses currently are being designed to operate in 5.0 volt and 3.3 volt systems. Pulldown circuits have been used in 5.0 volt systems to improve system performance. Examples of I/O buffers designed for 5.0 volt systems having a pulldown circuit are as follows: U.S. Pat. No. 5,248,906, entitled, High Speed CMOS Output Buffer Circuit Minimizes Output Signal Oscillation and Steady Stay Current, and U.S. Pat. No. 5,321,319, entitled, High Speed CMOS Bus Driver Circuit That Provides Minimum Output Signal Oscillation, both by Mahmood and both assigned to the common assignee of the present invention. These references describe a slew rate controlled output buffer circuit that transitions a pulldown output transistor through several transistor levels (VTNs), to prevent current transient noise during the pulldown process for VCC=5.0 volts.

A need exists for a I/O buffer output buffer driver capable of operating in either a 5.0 or 3.3 volt environment. For 3.3 volt operation, the 5.0 volt pulldown transition circuitry of the prior art is unnecessary since current transients are inherently minimized for 3.3 volt systems.

A need also exists for an I/O buffer capable of driving capacitive loads on an ISA bus ranging from 60 pF to 240 pF, at 5.0 volts and 3.3 volts. The two prior art references discussed above do not provide this capability.

SUMMARY OF THE INVENTION

The present invention is for a programmable current drive output buffer which, using control bits, can be programmed to select a current drive capability of 6 mA–24 mA for driving a ISA bus with capacitive loads ranging from 60 pF to 240 pF. This programmable drive strength buffer circuitry is operable at both 3.3 volt and 5.0 volt operating supply voltages.

DETAILED DESCRIPTION OF THE PREFERRED EMBODIMENT

Figure 1:
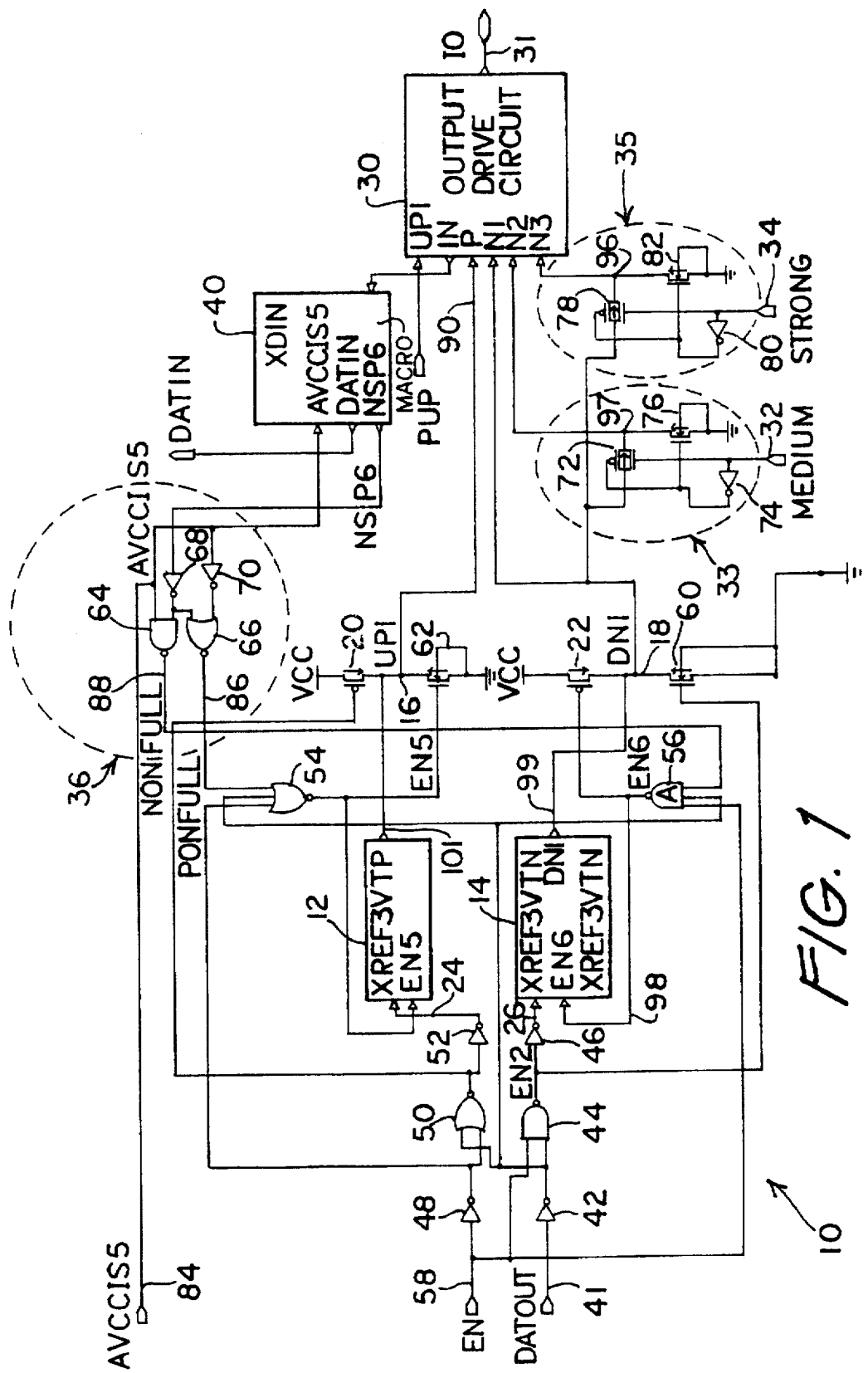
FIG. 1 schematically illustrates the output buffer of the present invention.
Figure 2:
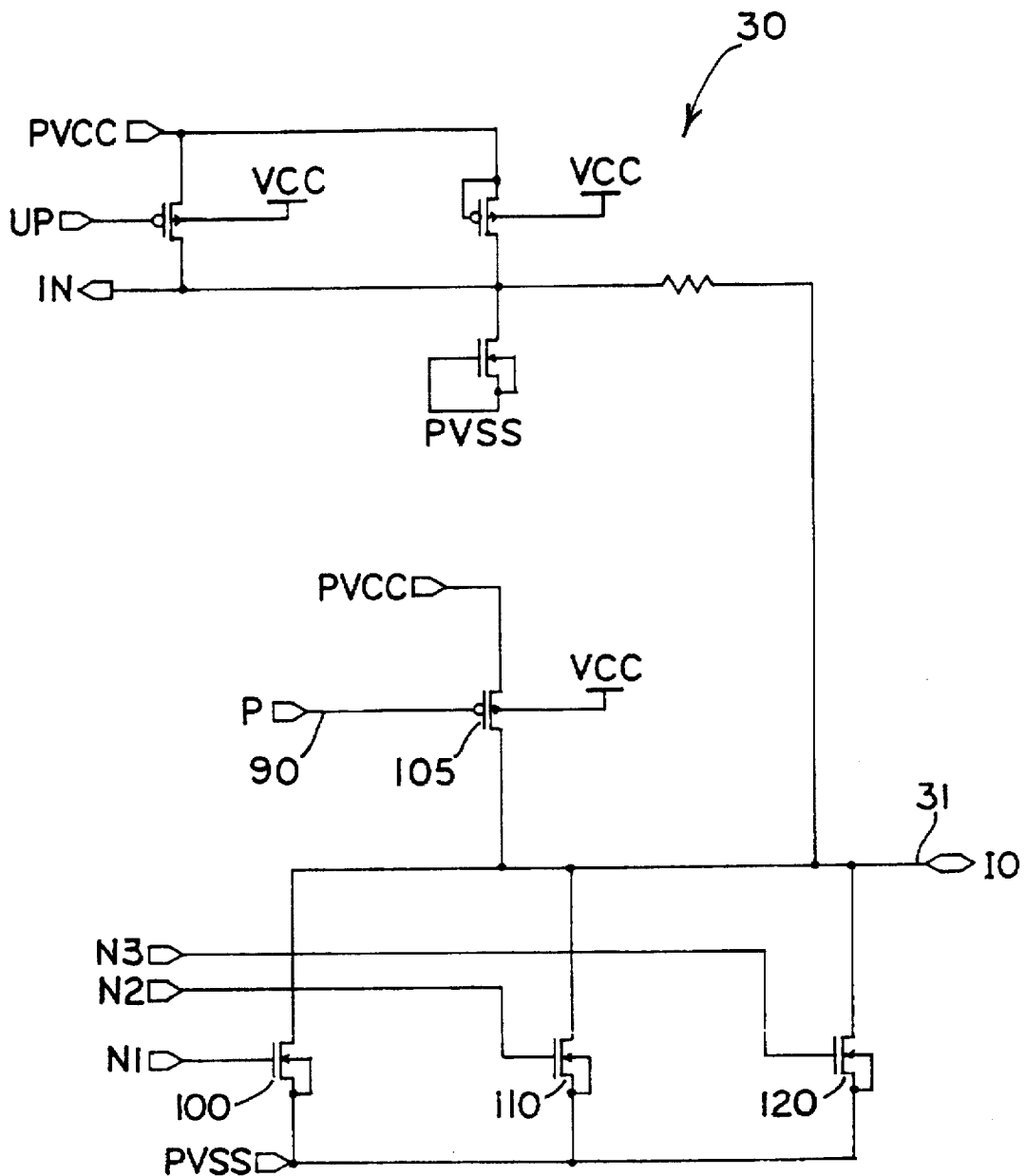
FIG. 2 schematically illustrates the programmable output drive circuit of the output buffer of the present invention.

FIG. 1 illustrates the programmable output strength I/O buffer 10 of the present invention. I/O buffer 10 is drive strength programmable to operate in either a 5.0 volt or 3.3 volt system for driving an ISA bus directly while experiencing capacitive loads of 240 pF, 120 pF or 60 pF. Two voltage reference generators, 12 and 14, are used to provide a voltage clamp on pullup node 16 and pulldown node 18, respectively. Voltage reference generator 12 controls the voltage on the gate of pullup P-channel output transistor 105 (FIG. 2). Output 101 of voltage reference generator 12 is connected to pullup node 16, which is in turn connected to input 90 of output drive circuit 30.

Voltage reference generator 14 controls the voltage on the gate of pulldown N-channel output drive transistor 100. Slew rate control output 99 of voltage reference generator 14 is connected to pulldown node 18, which is in turn connected to the gate of output drive transistor 100. The gate on output drive transistor 100 is held to 3 (VTNs) thresholds above the source, by reference generator 14, until the signal output to I/O node 31 has switched, i.e. crossed the trip level from a logic '1' to a logic '0'. After the output signal has switched, the gate of pullup output drive transistor 100 is pulled up to the supply voltage rail.

Voltage reference generators 12 and 14 also provide propagation delay for input signals 24 and 26 through the respective voltage reference generators. Input signals 24 and 26 are passed through the respective voltage reference generator to which they are input and are output to pullup node 16 or pulldown node 18, respectively. A more detailed description of these voltage reference generators and the functions they perform is described in U.S. Pat. No. 5,248,906, High Speed CMOS Output Buffer Circuit Minimizes Output Signal Oscillation and Steady Stay Current, by Mahmood; and U.S. Pat. No. 5,321,319, High Speed CMOS Bus Driver Circuit That Provides Minimum Output Signal Oscillation, by Mahmood, both assigned to the common assignee of the present invention, and incorporated herein for all purposes.

I/O buffer 10 in FIG. 1 is capable of driving an ISA bus, or other capacitive load, at I/O node 31. It should be understood that although I/O buffer 10 of FIG. 1 will be described herein for driving an external TTL-level compatible capacitive load bus, I/O buffer 10 could also be used to drive any capacitive load signal line distributed to multiple devices, such as to clock buffers within an integrated circuit device.

Typically, an I/O buffer operating at 3.3 volts may have acceptable switching times, at worst case, which may produce unacceptably large current transients while the buffer operates at 5.0 volts. The present invention utilizes a control signal 84, AVCCIS5, to control the slew rate of the I/O buffer 10 drive circuitry in output drive circuit 30, such that the slew rate will be changed depending on whether the system is operating at 3.3 or 5.0 volts. Control signal 84 is used to disable the slew rate control output 99 of voltage reference generator when VCC=3.3 volts.

Data to be driven out of I/O buffer 10 through I/O node 31 arrives as output data signal DATOUT on input 41. Input 41 is connected to the input of inverter 42. The output of inverter 42 is connected to an input of NOR gate 50, to an input of NAND gate 44, to an input of NOR gate 54 and to an input of NAND gate 56. The remaining input to NAND gate 44 is connected to an enable signal 58. Enable signal 58 is also connected to an inverter 48 and to an input of NAND gate 56. The output of inverter 48 is connected to the remaining input of NOR gate 50 and to an input of NOR gate 54. The output of NOR gate 50 is connected to P-channel transistor 20 and to inverter 52. The output of inverter 52 is connected to an input of voltage reference generator 12.

The output of NAND gate 44 is connected to the gate of N-channel transistor 60 and to inverter 46. The output of inverter of 46 is connected to an input of voltage reference generator 14.

The output of voltage reference generator 12 is provided to pullup node 16. The output of voltage reference generator 14 is input to pulldown node 18. The output of NOR gate 54 is input, as an enable EN5, to voltage reference generator 12 and to the gate of N-channel transistor 62. The output of NAND gate 56 is connected, as an enable 98, to voltage reference generator 14 and to the gate of P-channel transistor 22.

A control signal 84, AVCCIS5, is input to a mode control circuit 36, identified as the logic within the hashed line in FIG. 1. Control signal 84 is input to an input of NAND gate 64, to inverter 70 and to input data buffer 40. Input data buffer 40 is a data buffer which selects between one of two input buffer circuits (not shown), depending on whether operating at 5.0 or 3.3 volts. The output, NSP6, of the input data buffer circuit 40 is input to inverter 68. The output of inverter 68 is input to the remaining input of NAND gate 64 and to an input of NOR gate 66. The output of inverter 70 is also input to NOR gate 66. The output of NOR gate 66 is a signal 86, PONFULL, which is input as the remaining input to NOR gate 54. The output of NAND gate 64 is a signal 88, NONFULL, which is input as the remaining input to NAND gate 56. Whether operating at 5.0 volts or 3.3 volts, pulldown node 18 is always active whenever data is to be output through I/O node e1 of I/O buffer 10. Thus, N-channel weak output drive transistor 100 in output drive circuit 30 is always active. The discussion of current drive operation for driving 240 pF, 120 pF, and 60 pF loads assumes that enable input 58 in FIG. 1 is active at all times the output data signal on input 41 is active.

During 5.0 volt operation, the voltage level of pulldown node 18 is controlled by the slew rate output voltage 99 of voltage reference generator 14 such that N-channel weak output driver transistor 100 in output drive circuit 30, connected to pulldown node 18, is capable of driving capacitive loads ranging from 240 to 60 pF without additional current drive from additional output drive transistors. This is because voltage reference generator 14, through slew rate output voltage 99, which is input to pulldown node 18, slowly transitions the voltage level at pulldown node 18 up to 2 VTNs, then 3 VTNs so that current is slowly increased to weak output driver transistor 100, resulting in the signal level at I/O node 31 to be pulled down gradually, so large current transients are avoided. Control signal 84, AVCCIS5, while a logic '1', indicating VCC=5.0 volts, is input through mode control circuit 36, causing the enable input 98 of voltage reference generator 14 to remain enabled and thus the slew rate output voltage 99, active. This allows voltage reference generator 14 slew rate output voltage 99 to control the voltage slew rate from N-channel transistor 76 at pulldown node 18.

Voltage reference generator 14 functions as a slew rate generator for I/O buffer 10 by transitioning pulldown node 18, and thus the gate of output drive transistor 100, up to 2 VTNs, then 3 VTNs, in order to slowly increase the voltage at pulldown node 18, which is provided at the gate of N-channel weak output drive transistor 100 in output drive circuit 30 (FIG. 2), so that during 5.0 volt operation, large current transients during pulldown of the output data signal 41 through I/O buffer 10 are avoided. Voltage reference generator 14 is a 3-threshold reference circuit.

Pulldown node 18 is also connected to medium select drive current circuit 33 and strong select drive current circuit 35, each shown within hashed lines in FIG. 1. Medium select drive current circuit 33 includes medium drive select input 32, which is connected to inverter 74 and to CMOS transfer gate, or switch, 72. The output of inverter 74 is connected to switch 72 as an enable signal and is connected to the gate of N-channel transistor 76. Pulldown node 18 is connected to the input of switch 72, whereby when medium drive select input 32 is a logic '1', indicating a 120 pF load is to be driven, switch 72 is enabled by signal 32 and transistor 76 is turned off, thereby allowing the signal on pulldown node 18 to pass through switch 72 and be output to N-channel medium output drive transistor 110 in output drive circuit 30. For driving a 120 pF load, strong drive select input 34 is at a logic '0', or disabled, which causes transistor 82 to connect strong output drive transistor 120 to ground, thereby disabling strong output drive transistor 120.

Strong select drive current circuit 35 includes strong drive select input 34, which is connected to inverter 80 and to CMOS transfer gate, or switch, 78. The output of inverter 80 is input as an enable to switch 78 and is connected to the gate of N-channel transistor 82. The source of N-channel transistors 76 and 82 is connected to ground which causes the medium output drive transistor 110 and strong output drive transistor 120 to be disabled when slew inputs 32 and 34 are active low, indicating weak drive strength has been selected. Pulldown node 18 is connected as an input to switch 78, whereby when strong drive select input 34 is active high, indicating a 240 pF load is to be driven, with a current drive capability of 24 mA, switch 78 is enabled and transistor 82 is turned off, thereby allowing the signal on pulldown node 18 to pass through switch 78 and be input to the gate of N-channel output drive transistor 120 in output drive circuit 30. For driving a 240 pF load, medium strength select input is also a logic high, or enabled, which enables switch 72, disables transistor 76 and allows pulldown node 18 to drive the gate of N-channel medium output drive transistor 110 in output drive circuit 30.

When control signal 84, AVCCIS5, is a logic '0', indicating a 3.3 volt operating condition, mode control circuit 86 outputs a logic '1' on output 88, NONFULL, which together with logic '1' levels on the other two inputs to NAND gate 56, disables enable 98 of voltage reference generator 14 which effectively disconnects slew rate output voltage 99 from controlling pulldown node 18 and the gate of output drive transistor 100. In this case, the logic '0' on the output of NAND gate 56 and the gate of P-channel transistor 22 will cause P-channel transistor 22 to drive output drive transistor 100 to the VCC rail without transitioning through VTN levels. If, while in 3.3 volt operation, it is desired to drive a 60 pF load, P-channel transistor 22 will drive pulldown node 18 which will drive the gate of output drive transistor 100 in output drive circuit 80. Medium drive select input 32 in FIG. 1 and strong drive select input 84 are both a logic '0', which causes transistors 76 and 82 to connect output drive transistors 110 and 120 to ground and disables medium select drive current circuit 33 and strong select drive current circuit 35 by disabling switches 72 and 78, respectively.

Programmable drive select bit inputs 32 and 34 are preferably controlled by a control register, which may be written to by system software on boot up to change the bit values contained therein, with one bit in the register controlling medium drive select input 32 and one bit controlling strong drive select input 84. The system software would need to recognize whether all card slots are being used, so the proper drive strength is selected via the select bit inputs 32 and 34. In other embodiments, the current drive strength programming, via inputs 32 and 34, may be accomplished with metal masks, a PLA, an EPROM, laser programming, by measuring the power supply and then electronically setting the inputs 32 and 34, or by any other selecting mechanism or means known to those in the art.

If, while at 3.3 volts, it is desired to drive a 120 pF capacitive load, input 32 receives a logic '1'. In this case, the voltage level of pulldown node 18 is input to the gate of output drive transistor 100 and the output 97 of switch 72 is input to the gate of medium output drive transistor 110 in output drive circuit 30. In this case, I/O output node 31 has twice the current drive capability it had with only weak output drive transistor 100 driving I/O output 31, in the case where a 60 pF load was to be driven.

Figure 3:
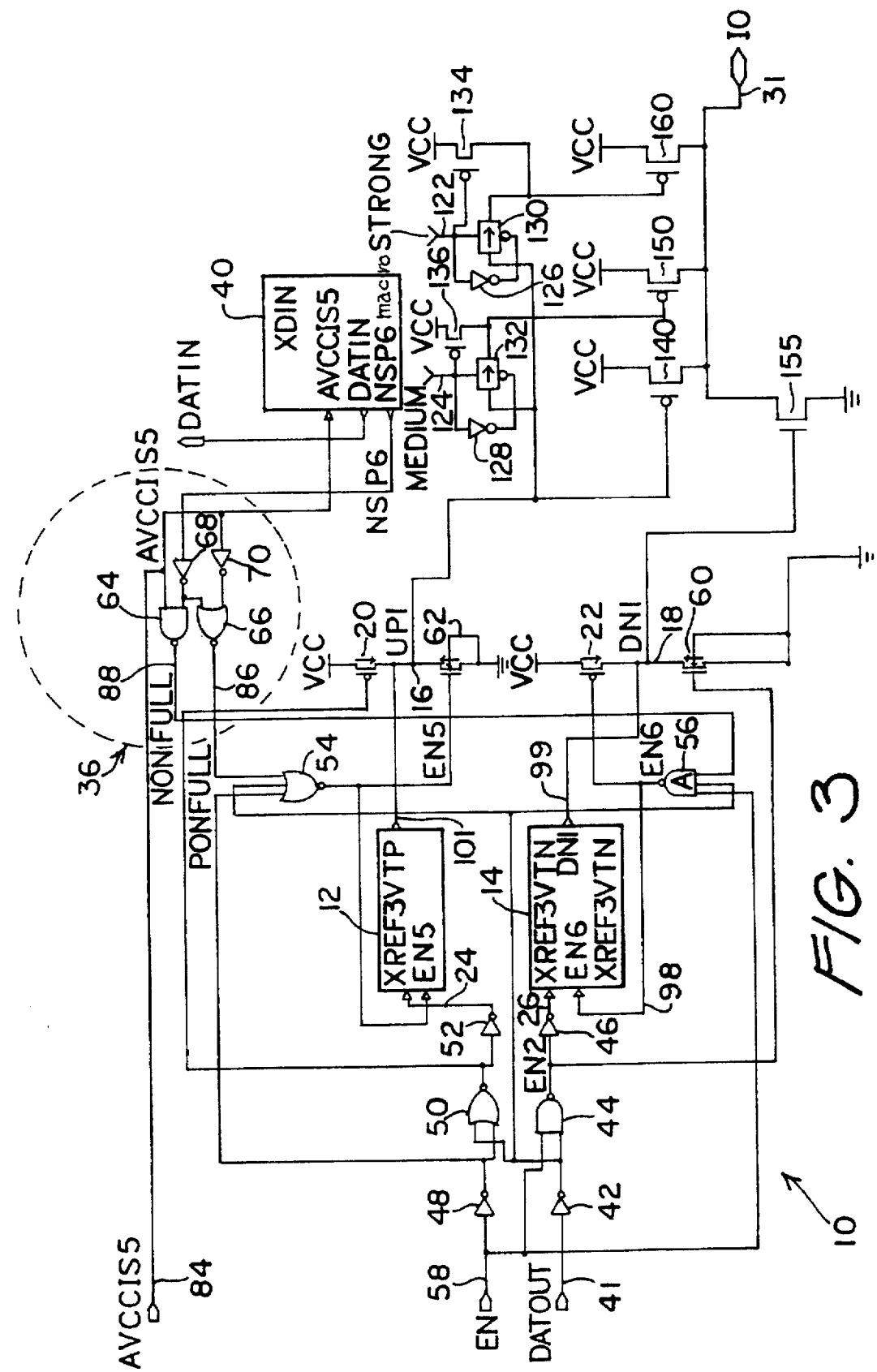
FIG. 3 schematically illustrates an embodiment of the present invention which includes a programmable pullup output drive circuit.

Referring to FIG. 3, another embodiment of a programmable drive strength output buffer of the present invention is shown. In this embodiment, three output drive transistors, 140, 150 and 160, are utilized. In this embodiment, pullup node 16 is connected to the gate of output drive pullup transistor 140 and is also connected to the input to transmission gate, switch, 132 and 130. When it is desired to output a weak drive current for a capacitive load of 60 pF, medium pullup select bit 124 and strong select bit 122 both are input with a logic '0'. A logic '0' on medium select input 124 causes output current pullup transistor 150 to be pulled to supply voltage, VCC by transistor 136. This effectively disables output current pullup transistor 150. A logic '0' on strong select input 122 causes output drive pullup transistor 160 to be disabled by transistor 134 being pulled to VCC. Thus, with weak current drive selected, with both medium and strong select bits 124 and 122 a logic '0', the signal on pullup node 16 is input to the gate of output current drive pullup transistor 140 which is then output by transistor 140 to I/O node 31.

In this embodiment, regardless of whether weak, medium or strong current drive pullup strength is selected, pulldown node 18 is connected to the gate of output drive current pulldown transistor 155. Transistor 155 is in turn connected to I/O node 31.

If a capacitive load of 120 pF is to be driven, output current pullup transistors 140 and 150 must be activated. To accomplish this, pullup node 16 drives output current pullup transistor 140, as explained previously. Also, medium current select bit to input 124 is a logic '1', which causes switch 132 to transmit the signal present at pullup node 16 through switch 132 to the source of transistor 136, where transistor 136 is disabled. The signal is provided to the gate of output drive pullup transistor 150. The output of transistors 140 and 150 are then combined and output via I/O node 31. Strong current select bit at input 122 remains a logic '0'.

When it is desired to drive a 240 pF capacitive load, both medium select bit at input 124 and strong select bit at input 122 are a logic '1'. The signal present at pullup node 16 is then input through switches 132 and 130 and output to output drive current pullup transistors 150 and 160, respectively. The output of these transistors, 150 and 160, combine with the output from transistor 140, which is connected to pullup node 16, are combined and output through I/O node 31.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A programmable current drive output buffer, comprising:

a first output data signal, input to a plurality of output drive current transistor circuits, wherein at least one of said output drive current transistor circuits includes a programmable current drive strength select bit input, wherein said bit is used to enable or disable said output drive transistor circuit to which it is input;

wherein an output of each of said plurality of output drive transistor circuits are connected to a common output buffer output node;

further comprising a second output data signal which is input to a pullup output drive current transistor, wherein an output of said pullup transistor is connected to said common output buffer output node, and wherein each of said plurality of output drive current transistor circuits includes a pulldown output drive current transistor circuit.

2. The output buffer of claim 1, wherein a first of said plurality of output drive current transistor circuits includes a first programmable output current drive strength select bit input and wherein a second of said plurality of transistor circuits includes a second programmable output current drive strength select bit input, wherein said first and said second output drive current transistor circuits each output a predetermined amount of drive current to said common output buffer output node when each respective transistor circuit is enabled by its respective programmable select bit input.

3. A programmable current drive output buffer, comprising:

a first output data signal, input to a plurality of output drive current transistor circuits, wherein at least one of said output drive current transistor circuits includes a programmable current drive strength select bit input, wherein said bit is used to enable or disable said output drive transistor circuit to which it is input;

wherein an output of each of said plurality of output drive transistor circuits are connected to a common output buffer output node;

further comprising a second output data signal which is input to a pulldown output drive current transistor, wherein an output of said pulldown transistor is connected to said common output buffer output node, and wherein each of said plurality of output drive current transistor circuits includes a pullup output drive current transistor circuit.

4. The output buffer of claim 1, wherein said output buffer provides an output current drive of from 6 mA to 24 mA.

5. A programmable current drive output buffer, comprising:

an output data signal, which is input to a first output drive current transistor circuit, wherein a signal output from said first output drive current transistor circuit is connected to a common output buffer output node;

a second output drive current transistor circuit, having an input connected to said output data signal, wherein a signal output from said second output drive current transistor circuit is connected to said common output buffer output node only when a first drive current strength select bit, which is input to said second output drive current transistor circuit, is enabled; and a third output drive current transistor circuit, having an input connected to said output data signal, wherein a signal output from said third output drive current transistor circuit is connected to said common output buffer output node only when a second drive current strength select bit, which is input to said third output drive current transistor circuit, is enabled;

wherein said output buffer output node has a current drive capability of from 6 mA to 24 mA.

6. The output buffer of claim 5, wherein when said first drive current strength select bit is enabled and said second drive current strength select bit is disabled, said output buffer output node has a current drive capability of about 12 mA over a 120 pF capacitive load.

7. The output buffer of claim 5, wherein when said first and said second drive current strength select bits are enabled, said output buffer output node has a current drive capability of from 6 mA to 24 mA over a capacitive load ranging from 60 pF to 240 pF.

8. A method of selecting a drive current output for an output buffer, comprising the steps of:

providing a plurality of current drive transistor circuits;

providing a programmable current drive strength select bit to at least one of said plurality of current drive transistor circuits;

providing an output data signal to an input of each of said plurality of transistor circuits;

connecting an output of each of said plurality of transistor circuits to a common output buffer output node;

selecting a drive current to be output from said common output buffer output node by enabling said current drive strength select bit input for at least one of said plurality of current drive transistor circuits;

wherein said drive current to be output from said common output buffer output node is selected to be about 6 mA, 12 mA or 24 mA by selectively enabling or disabling said select bit input to said at least one current drive transistor circuit.

9. An output buffer of the type which includes a slew rate control circuit, comprising:

a voltage reference generator, which controls the slew rate of a data signal to be output from said output buffer;

a VCC control signal, which is input to a mode control logic circuit, wherein an output of said mode control logic circuit is input to said voltage reference generator as an enable signal;

wherein said VCC control signal is at a first logic state when the supply voltage (VCC) of said output buffer is equal to about 5.0 volts and is at a second logic state when said supply voltage is equal to about 3.3 volts.

10. The output buffer of claim 9, wherein said first logic state is a logic '1' and said second logic state is a logic '0'.

11. The output buffer of claim 9, wherein said voltage reference generator includes a slew rate control output which is connected to an output current drive transistor, wherein said slew rate control output controls the gate voltage of said output current drive transistor.

12. The output buffer of claim 11, wherein said slew rate control output is disabled when said VCC control signal is at said second logic state.

* * * * *